(12) United States Patent
Wang et al.

(10) Patent No.: US 12,102,014 B2
(45) Date of Patent: *Sep. 24, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hui-Lin Wang, Taipei (TW); Chia-Chang Hsu, Kaohsiung (TW); Chen-Yi Weng, New Taipei (TW); Chin-Yang Hsieh, Tainan (TW); Jing-Yin Jhang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/376,437

(22) Filed: Oct. 3, 2023

(65) Prior Publication Data

US 2024/0032440 A1    Jan. 25, 2024

Related U.S. Application Data

(60) Continuation of application No. 17/867,702, filed on Jul. 19, 2022, now Pat. No. 11,818,965, which is a
(Continued)

(30) Foreign Application Priority Data

Oct. 29, 2018    (CN) ......................... 201811267036.0

(51) Int. Cl.
*H10B 61/00* (2023.01)
*G11C 11/16* (2006.01)
*H01F 10/32* (2006.01)
*H01F 41/34* (2006.01)
*H10N 50/01* (2023.01)
(Continued)

(52) U.S. Cl.
CPC ........... *H10N 50/80* (2023.02); *G11C 11/161* (2013.01); *H01F 10/3254* (2013.01); *H01F 41/34* (2013.01); *H10B 61/00* (2023.02); *H10N 50/01* (2023.02); *H10N 50/85* (2023.02)

(58) Field of Classification Search
CPC ........ H10N 50/80; H10N 50/01; H10B 61/00; H01L 23/3675
See application file for complete search history.

(56) References Cited

U.S. PATENT DOCUMENTS 6,248,151 B1*  6/2001  Horine .................... C23C 4/123
                                                75/335
7,726,545 B2*  6/2010  Ichiryu ................... H01L 24/11
                                                228/248.1
(Continued)

FOREIGN PATENT DOCUMENTS

CN    102855929 A    1/2013
CN    106298831 A    1/2017

*Primary Examiner* — Nathan W Ha
(74) *Attorney, Agent, or Firm* — Winston Hsu

(57) ABSTRACT

A semiconductor device includes a substrate comprising a MTJ region and a logic region, a magnetic tunneling junction (MTJ) on the MTJ region, and a contact plug on the logic region. Preferably, the MTJ includes a bottom electrode layer having a gradient concentration, a free layer on the bottom electrode layer, and a top electrode layer on the free layer.

4 Claims, 8 Drawing Sheets

Related U.S. Application Data continuation of application No. 17/064,607, filed on Oct. 7, 2020, now Pat. No. 11,430,946, which is a division of application No. 16/200,520, filed on Nov. 26, 2018, now Pat. No. 10,840,432.

(51) Int. Cl.
*H10N 50/80* (2023.01)
*H10N 50/85* (2023.01)

(56) References Cited

U.S. PATENT DOCUMENTS

| | | | |
|---|---|---|---|
| 7,799,607 B2* | 9/2010 | Karashima | H01L 24/81 438/615 |
| 9,818,935 B2 | 11/2017 | Chuang et al. | |
| 9,997,699 B2 | 6/2018 | Kim | |
| 10,026,888 B2 | 7/2018 | Ochiai | |
| 10,164,182 B1 | 12/2018 | Trinh | |
| 10,199,302 B1* | 2/2019 | Sanchez | H01L 21/4842 |
| 10,361,162 B1 | 7/2019 | Bhushan | |
| 10,381,466 B1 | 8/2019 | Khizroev | |
| 10,553,789 B1 | 2/2020 | Lanzillo | |
| 10,840,432 B2* | 11/2020 | Wang | H01F 10/3254 |
| 11,818,965 B2* | 11/2023 | Wang | H01F 41/34 |
| 2006/0211231 A1 | 9/2006 | Asano | |
| 2011/0024101 A1* | 2/2011 | Han | H01L 21/4882 165/185 |
| 2011/0133300 A1 | 6/2011 | Xiao et al. | |
| 2014/0151831 A1 | 6/2014 | Chen | |
| 2014/0286084 A1* | 9/2014 | Watanabe | H10N 50/10 365/158 |
| 2014/0301138 A1* | 10/2014 | Mani | G11C 11/1657 365/171 |
| 2014/0306304 A1* | 10/2014 | Guo | H10N 50/01 257/421 |
| 2014/0332766 A1* | 11/2014 | Bang | H10K 10/20 257/40 |
| 2014/0374897 A1* | 12/2014 | Zhao | F28F 21/081 438/584 |
| 2015/0101785 A1* | 4/2015 | Ho | H01L 21/4882 165/170 |
| 2015/0325623 A1 | 11/2015 | Chepulskyy | |
| 2016/0049447 A1 | 2/2016 | Jung | |
| 2017/0133434 A1 | 5/2017 | Ueki | |
| 2017/0179002 A1* | 6/2017 | Chainer | H01L 23/473 |
| 2017/0345999 A1 | 11/2017 | Noh | |
| 2018/0269128 A1* | 9/2018 | Limaye | H01L 24/83 |
| 2018/0374714 A1* | 12/2018 | Stathakis | H01L 23/367 |
| 2019/0140166 A1 | 5/2019 | Rahman | |
| 2019/0172726 A1* | 6/2019 | Berntson | H01L 23/3736 |
| 2019/0245141 A1 | 8/2019 | Yang | |
| 2019/0280195 A1 | 9/2019 | Sonoda | |
| 2019/0348345 A1* | 11/2019 | Parida | H01L 25/18 |
| 2020/0044146 A1 | 2/2020 | Wu | |
| 2020/0052196 A1 | 2/2020 | Shen | |
| 2020/0168523 A1* | 5/2020 | Huang | F28F 13/18 |
| 2020/0203600 A1 | 6/2020 | Xue | |
| 2020/0219786 A1* | 7/2020 | Hung | H01L 23/562 |
| 2020/0227338 A1* | 7/2020 | Gong | H01L 23/3735 |
| 2020/0227339 A1* | 7/2020 | Schwab | C08L 83/04 |
| 2020/0263285 A1* | 8/2020 | Stowell | C23C 4/067 |
| 2021/0126246 A1* | 4/2021 | Gazda | H01M 4/587 |

* cited by examiner

SEMICONDUCTOR DEVICE AND METHOD FOR FABRICATING THE SAME

CROSS REFERENCE TO RELATED APPLICATIONS

This application is a continuation application of U.S. application Ser. No. 17/867,702, filed on Jul. 19, 2022, which is a continuation application of U.S. application Ser. No. 17/064,607, filed on Oct. 7, 2020, which is a division of U.S. application Ser. No. 16/200,520, filed on Nov. 26, 2018. The contents of these applications are incorporated herein by reference.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes a substrate comprising a MTJ region and a logic region, a magnetic tunneling junction (MTJ) on the MTJ region, and a contact plug on the logic region. Preferably, the MTJ includes a bottom electrode layer having a gradient concentration, a free layer on the bottom electrode layer, and a top electrode layer on the free layer.

According to another aspect of the present invention, a semiconductor device includes a magnetic tunneling junction (MTJ) on a substrate and an alignment mark adjacent to the MTJ. Preferably, the MTJ includes a bottom electrode layer having a gradient concentration, a free layer on the bottom electrode layer, and a top electrode layer on the free layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
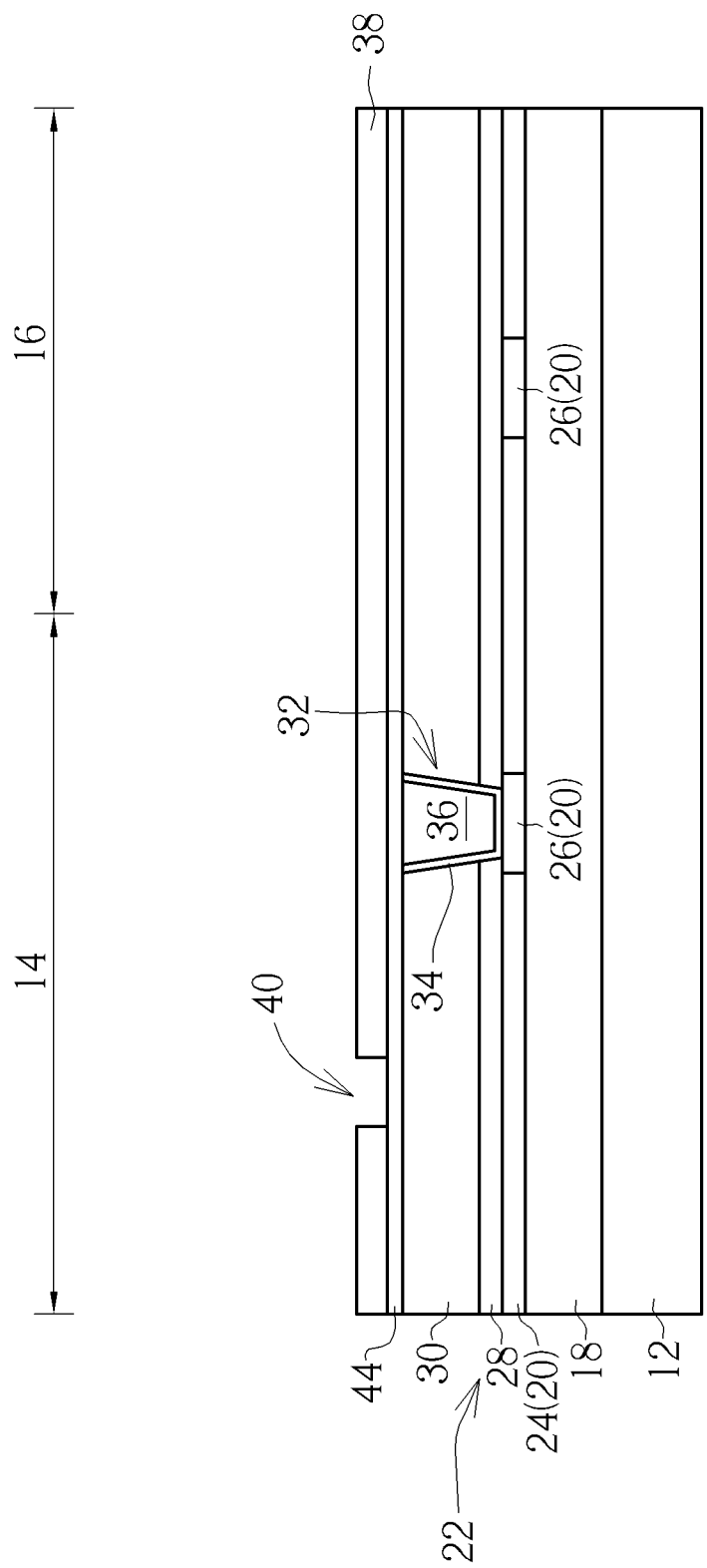
FIGS. 1-6 illustrate a method for fabricating a MRAM device according to an embodiment of the present invention.

Referring to FIGS. 1-6, FIGS. 1-6 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnection 32 embedded in the stop layer 28 and the IMD layer 30.

In this embodiment, each of the metal interconnections 26 from the metal interconnect structure 20 preferably includes a trench conductor 46 and each of the metal interconnection 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layer 28 is preferably made of nitrogen doped carbide (NDC), silicon nitride, silicon carbon nitride (SiCN), or combination thereof.

Next, a bottom electrode layer 44 and a patterned mask 38 such as a patterned resist are formed on the IMD layer 30, in which the patterned mask 38 preferably includes an opening 40 exposing the top surface of the bottom electrode layer 44. In this embodiment, the bottom electrode 44 preferably includes conductive material such as TaN, but could also include other material including but not limited to for example Ta, Pt, Cu, Au, Al, or combination thereof.

It should be noted that the bottom electrode layer 44 preferably includes a concentration gradient such that the concentration distribution is not uniform throughout the entire bottom electrode layer 44 and the concentration distribution could gradually increase upward, decrease upward, increase downward, or decrease downward depending on the material being used. In this embodiment the bottom electrode layer 44 is preferably made of TaN and in such instance, the concentration of nitrogen preferably increases from a bottom surface of the bottom electrode layer 44 to a top surface of the bottom electrode layer 44 while the concentration of tantalum decreases from a bottom surface of the bottom electrode layer 44 to a top surface of the bottom electrode layer 44. In other words, the region or area in the layer 44 immediately adjacent to the bottom surface of the bottom electrode layer 44 or immediate adjacent to the junction between the bottom electrode layer 44 and the metal interconnection 32 preferably includes higher concentration of tantalum atoms and/or lower concentration of nitrogen atoms, whereas the region or area in the layer 44 immediately adjacent to the top surface of the bottom electrode layer 44 preferably includes higher concentration of nitrogen atoms and/or lower concentration of tantalum atoms. Specifically, a ratio of nitrogen to tantalum closest to or at a top surface of the bottom electrode layer 44 is between 1.53 to 1.87 and a ratio of nitrogen to tantalum closest to or at a bottom surface of the bottom electrode layer 44 is between 0.18 to 0.22.

Figure 2:
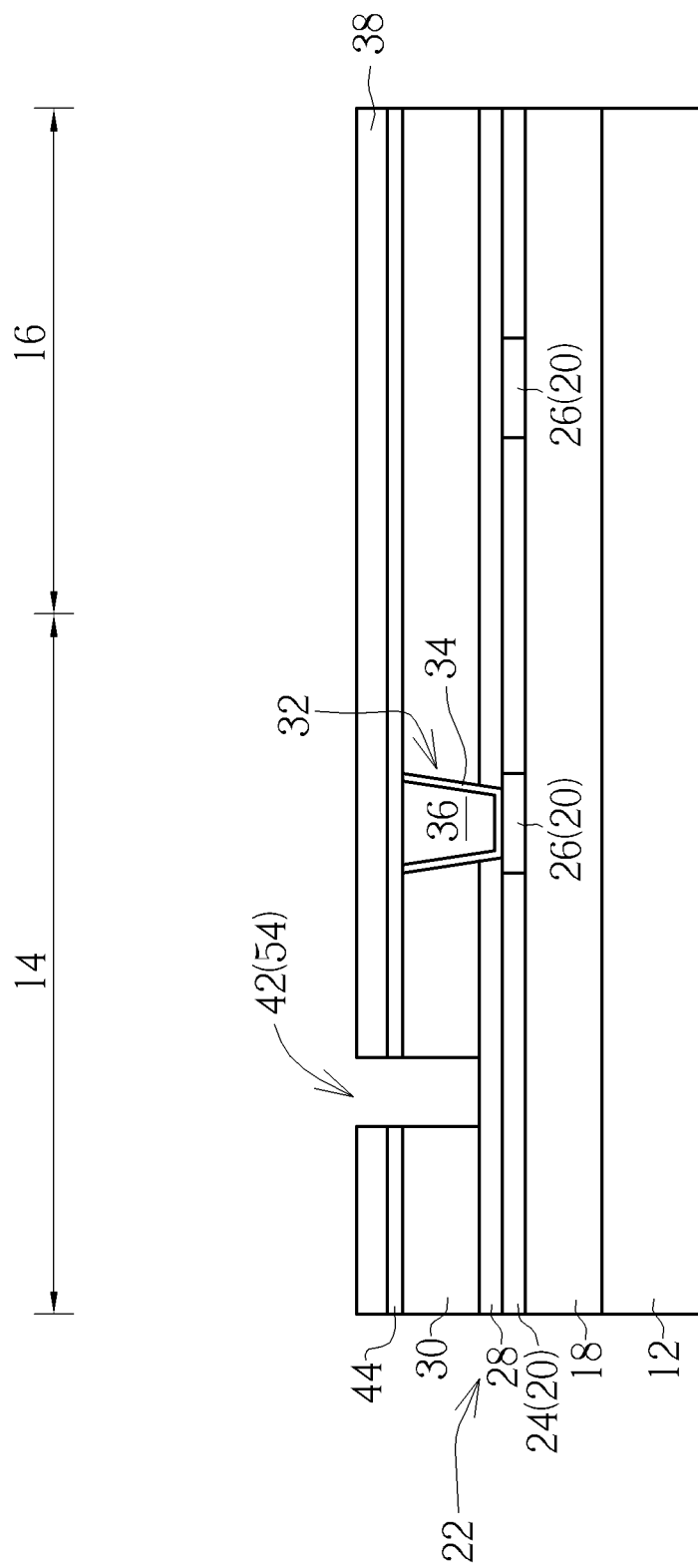

Next, as shown in FIG. 2, an etching process is conducted by using the patterned mask 38 as mask to remove part of the bottom electrode layer 44 and part of the IMD layer 30 to form a trench 42 serving as an alignment mark 54, and the patterned mask 38 is removed thereafter. It should be noted that even though the bottom surface of the trench 42 is even with a bottom surface of the IMD layer 30 in this embodiment, according to another embodiment of the present invention, the bottom surface of the trench 42 could also be slightly higher than the bottom surface of the IMD layer 30, slightly lower than the bottom surface of the IMD layer 30 and extended into part of the stop layer 28, which are all within the scope of the present invention.

Figure 3:
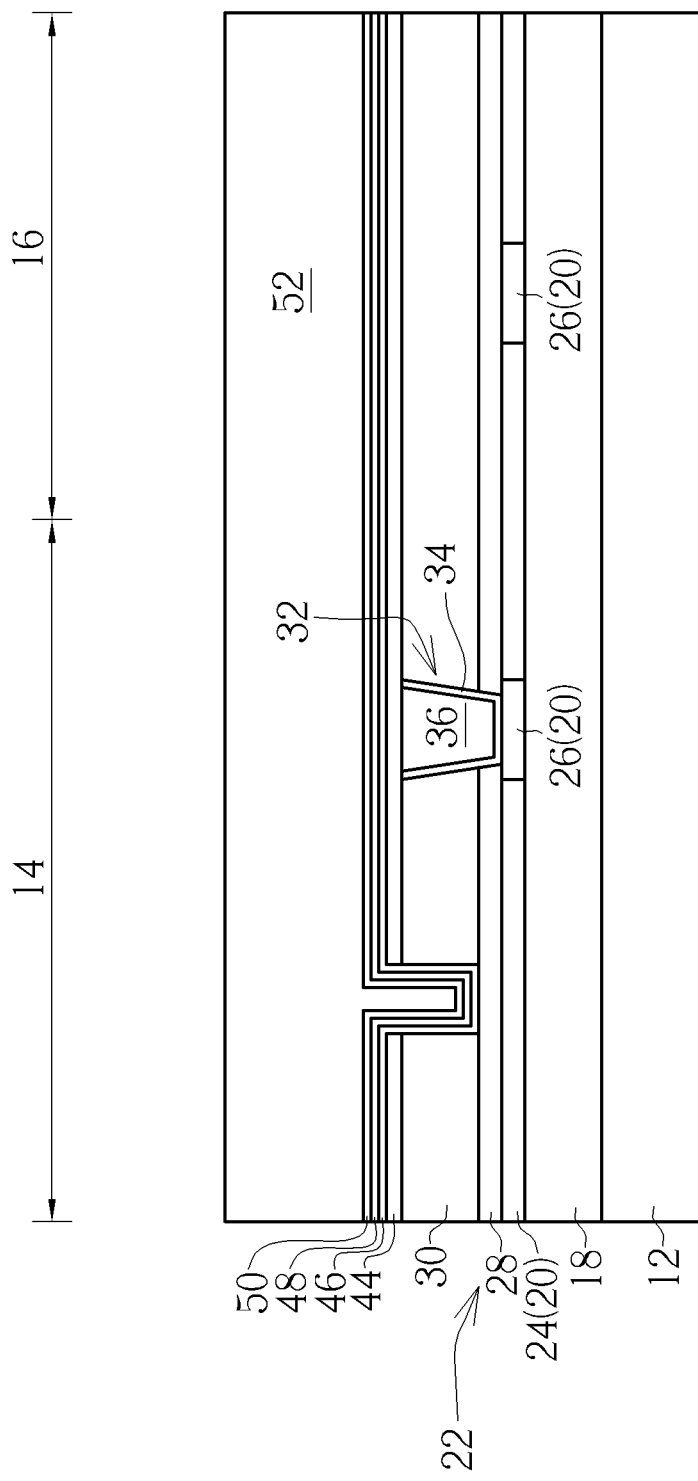

Next, as shown in FIG. 3, a pinned layer 46, a barrier layer 48, a free layer 50, and a top electrode layer 52 are sequentially formed on the bottom electrode layer 44 and filled into the trench 42.

Figure 4:
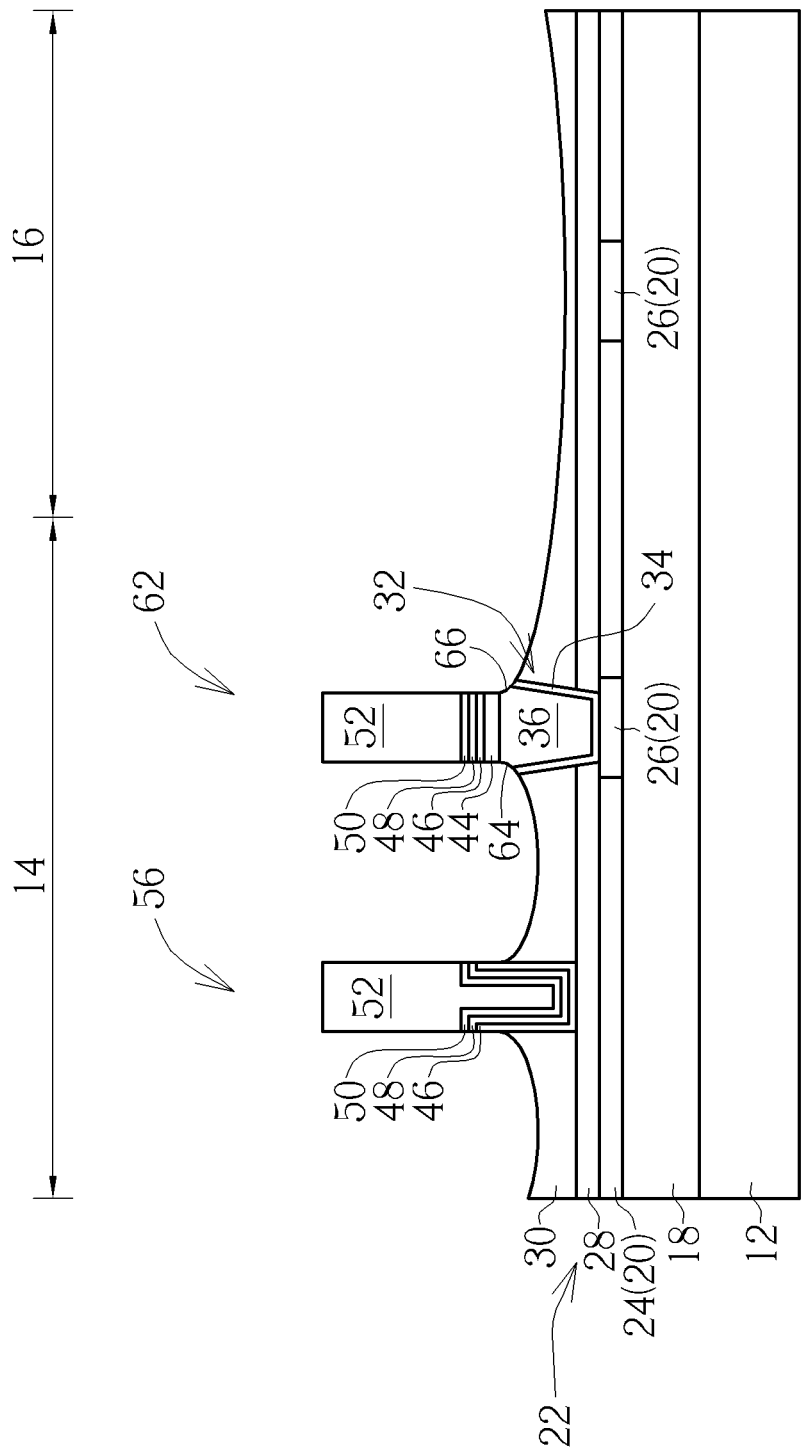

Next, as shown in FIG. 4, a photo-etching process is conducted to pattern the top electrode layer 52, the free layer 50, the barrier layer 48, the pinned layer 46, and the bottom electrode layer 44 to form a MTJ 62 and an alignment mark 56 adjacent to the MTJ 62, in which the alignment mark 56 could be used to facilitate the formation of metal interconnections on the logic region 16 in later process. In this embodiment, the pinned layer 46 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 46 is formed to fix or limit the direction of magnetic moment of adjacent layers. The barrier layer 48 could include oxide containing insulating material such as but not limited to for example aluminum oxide (AlOx) or magnesium oxide (MgO). The free layer 50 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field. The top electrode layer 52 and the bottom electrode layer 44 could be made of same or different conductive materials while the two layers 52, 44 could all be selected from the group consisting of Ta, Pt, Cu, Au, and Al.

It should be noted that an ion beam etching (IBE) process is preferably conducted to remove part of the top electrode layer 52, part of the free layer 50, part of the barrier layer 48, part of the pined layer 46, part of the bottom electrode layer 44, and part of the IMD layer 30 to form the MTJ 62. Due to the characteristics of the IBE process, the top surface of the remaining IMD layer 30 is slightly lower than the top surface of the metal interconnection 32 after the IBE process and the top surface of the IMD layer 30 also reveals a curve or an arc.

It should also be noted that when the IBE process is conducted to remove part of the IMD layer 30, part of the metal interconnection 32 is removed at the same time so that a first slanted sidewall 64 and a second slanted sidewall 66 are formed on the metal interconnection 32 adjacent to the MTJ 62, in which each of the first slanted sidewall 64 and the second slanted sidewall 66 could further include a curve (or curved surface) or a planar surface.

Figure 5:
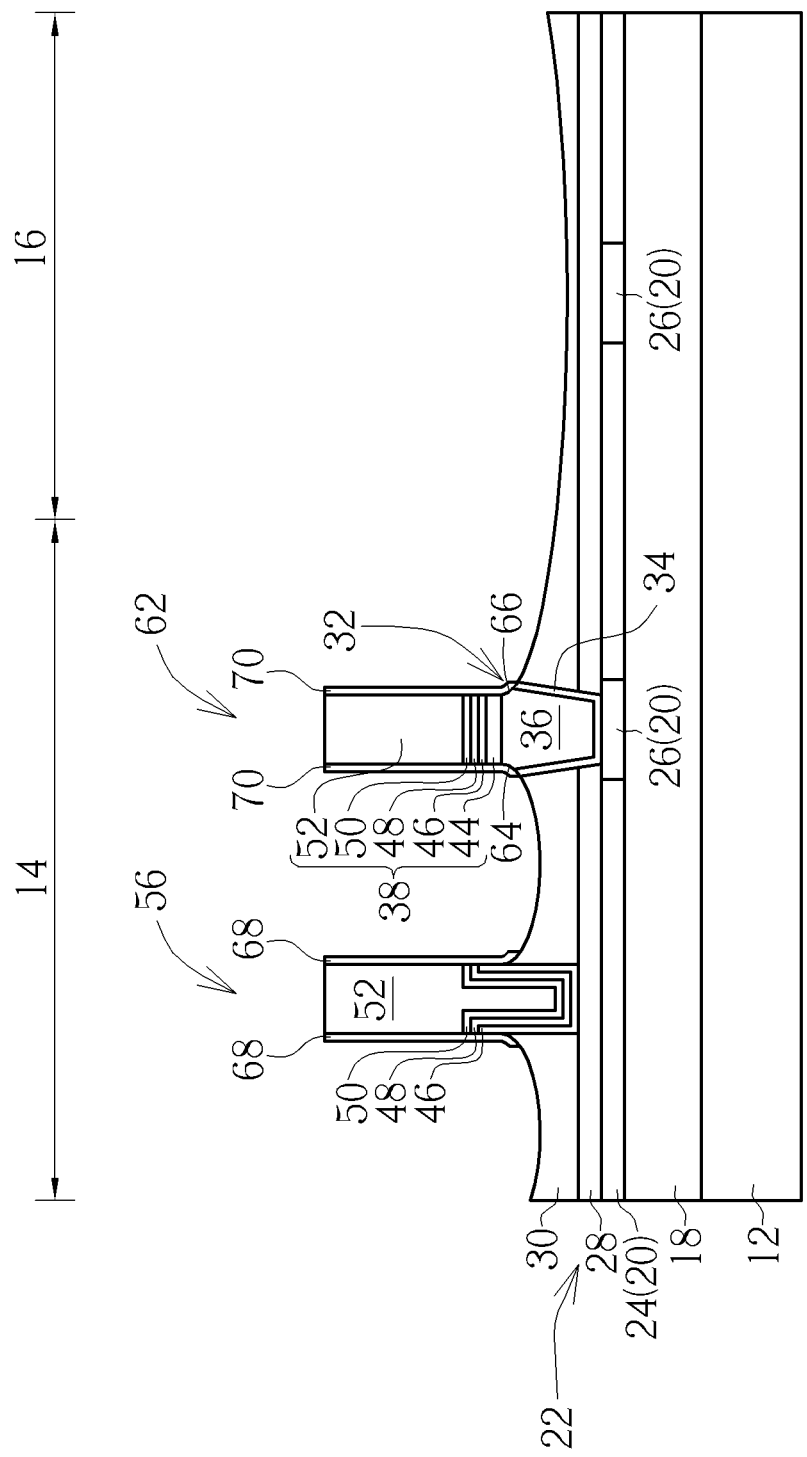

Next, as shown in FIG. 5, a liner (not shown) is formed on the MTJ 62 to cover the surface of the IMD layer 30. In this embodiment, the liner is preferably made of silicon oxide, but could also be made of other dielectric material including but not limited to for example silicon oxide, silicon oxynitride, or silicon carbon nitride. Next, an etching process is conducted to remove part of the liner to form a spacer 70 adjacent to the MTJ 62 and another spacer 68 adjacent to the alignment mark 56, in which the spacer 70 is disposed on the sidewalls of the MTJ 62 and at the same time covering and contacting the first slanted sidewalls 64 and second slanted sidewalls 66 of the metal interconnection 32 directly.

Figure 6:
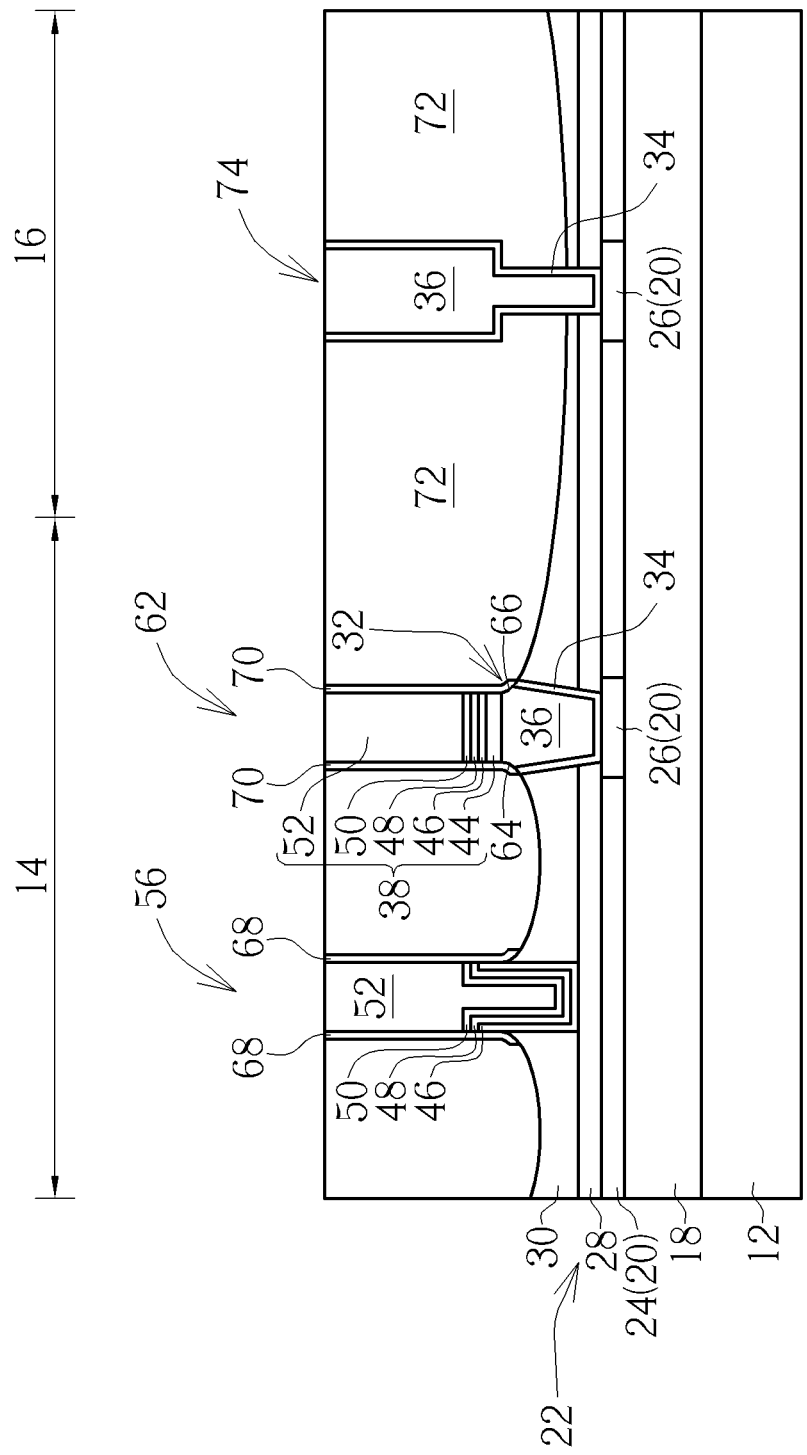

Next, as shown in FIG. 6, another IMD layer 72 is formed on the MTJ region 14 and logic region 16, and a planarizing process such as CMP is conducted to remove part of the IMD layer 72 so that the top surface of the ID layer 72 is even with the top surface of the MTJ 62. Next, a pattern transfer process is conducted by using a patterned mask (not shown) to remove part of the IMD layer 72 on the logic region 16 to form a contact hole (not shown) exposing the metal interconnection 26 underneath and metals are deposited into the contact hole afterwards. For instance, a barrier layer 34 selected from the group consisting of titanium (Ti), titanium nitride (TiN), tantalum (Ta), and tantalum nitride (TaN) and metal layer 36 selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the metals including the aforementioned barrier layer 34 and metal layer 36 to form a contact plug 74 in the contact hole electrically connecting the metal interconnection 26. This completes the fabrication of a semiconductor device according to an embodiment of the present invention.

Referring again to FIG. 6, which further illustrates a structural view of a semiconductor device according to an embodiment of the present invention. As shown in FIG. 6, the semiconductor device includes a MTJ 62 disposed on the substrate 12, in which the MTJ 62 further includes a bottom electrode layer 44, a pinned layer 46 disposed on the bottom electrode layer 44, a barrier layer 48 disposed on the pinned layer 46, a free layer 50 disposed on the barrier layer 48, and a top electrode layer 52 disposed on the free layer 50.

In this embodiment, the bottom electrode layer 44 preferably includes a concentration gradient or more specifically that the concentration distribution of the bottom electrode layer 44 could gradually increase upward, decrease upward, increase downward, or decrease downward depending on the material being used. In this embodiment the bottom electrode layer 44 is preferably made of TaN and in such instance, the concentration of nitrogen preferably increases from a bottom surface of the bottom electrode layer 44 to a top surface of the bottom electrode layer 44 while the concentration of tantalum decreases from a bottom surface of the bottom electrode layer 44 to a top surface of the bottom electrode layer 44. In other words, the region or area in the layer 44 immediately adjacent to the bottom surface of the bottom electrode layer 44 or immediate adjacent to the junction between the bottom electrode layer 44 and the metal interconnection 32 preferably includes higher concentration of tantalum atoms and/or lower concentration of nitrogen atoms, whereas the region or area in the layer 44 immediately adjacent to the top surface of the bottom electrode layer 44 preferably includes higher concentration of nitrogen atoms and/or lower concentration of tantalum atoms. Specifically, a ratio of nitrogen to tantalum closest to or at a top surface of the bottom electrode layer 44 is between 1.53 to 1.87 and a ratio of nitrogen to tantalum closest to or at a bottom surface of the bottom electrode layer 44 is between 0.18 to 0.22.

The semiconductor device further includes an alignment mark 56 disposed adjacent to the MTJ 62, in which the alignment mark 56 includes a pinned layer 46 disposed within the IMD layer 30 and on the stop layer 28, a barrier layer 48 disposed on the pinned layer 46, a free layer 50 disposed on the barrier layer 48, and a top electrode layer 52 disposed on the free layer 50. Preferably, each of the pinned layer 46, barrier layer 48, and free layer 50 includes U-shaped cross-section and the bottom surface of the alignment mark 56 is even with the bottom surface of the IMD layer 30 and slightly lower than the bottom surface of the MTJ 62.

Figure 7:
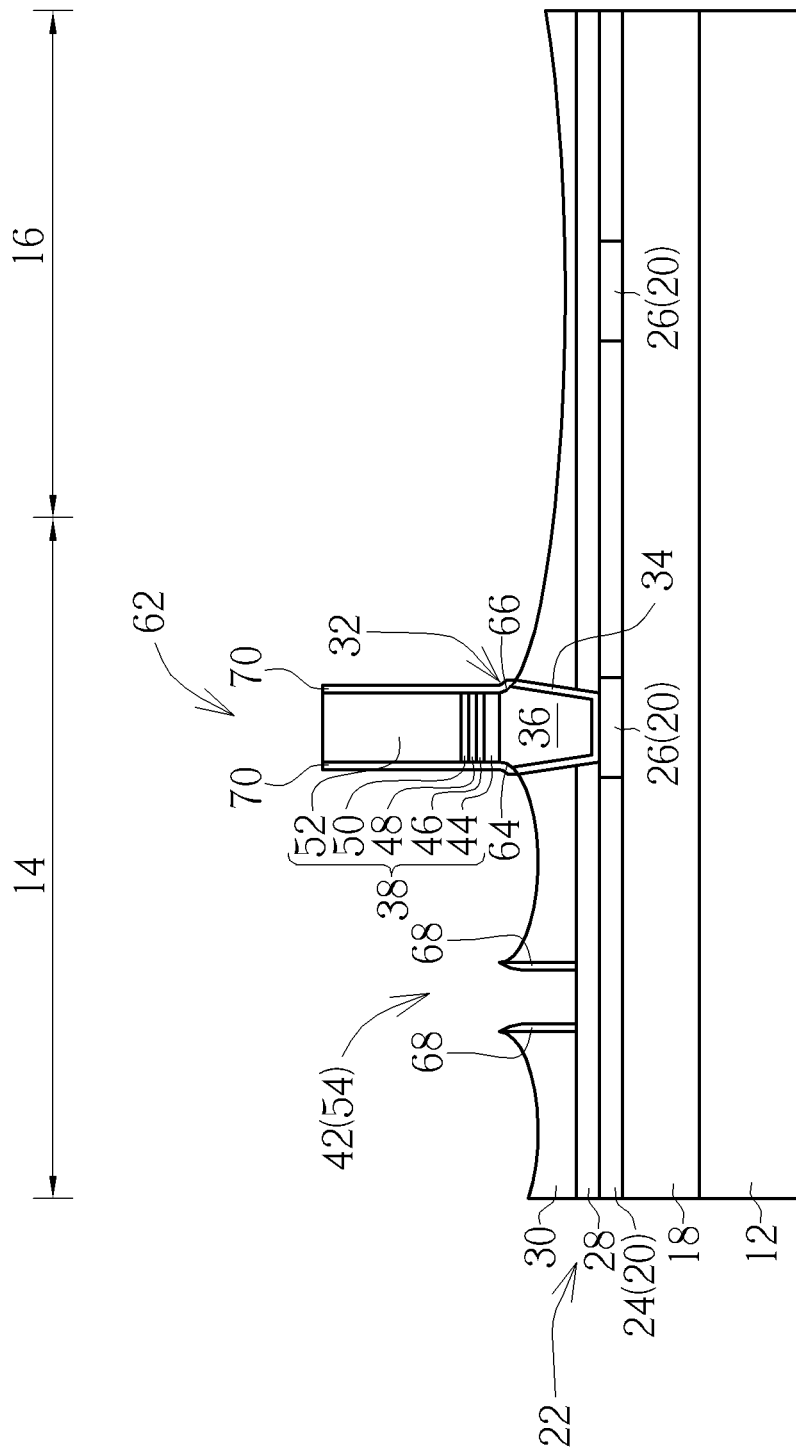
FIGS. 7-8 illustrate a method for fabricating a MRAM device according to an embodiment of the present invention.
Figure 8:
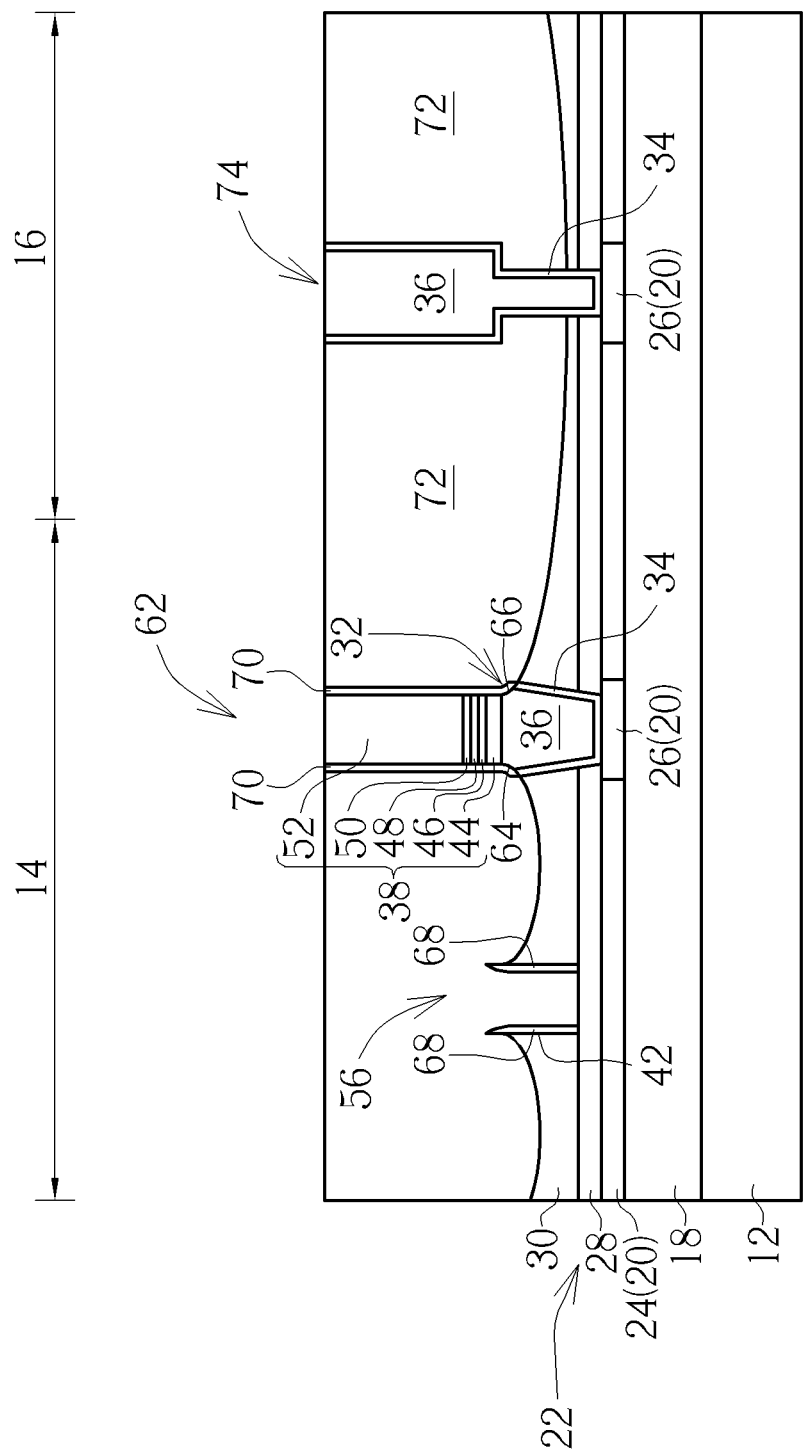

Referring to FIGS. 7-8, FIGS. 7-8 illustrate a method for fabricating a semiconductor device according to an embodiment of the present invention. As shown in FIG. 7, it would be desirable to conduct a photo-etching process to pattern the top electrode layer 52, free layer 50, barrier layer 48, pinned layer 46, and bottom electrode layer 44 to form the MTJ 62 as shown in FIG. 4, and at the same time remove the top electrode layer 52, free layer 50, barrier layer 48, and pinned layer 46 in the trench 42 or alignment mark 54 to expose the surface of the stop layer 28 once more. Next, it would be desirable to form a liner (not shown) as shown in FIG. 5 on the MTJ 62 to cover the surface of the ID layer 30 and filling part of the trench 42, and then an etching process is conducted to remove part of the liner to form a spacer 70 adjacent to the MTJ 62 and a spacer 68 in the trench 42 or more specifically on the inner sidewalls of the alignment mark 54.

Next, as shown in FIG. 8, another IMD layer 72 is formed on the MTJ region 14 and logic region 16 as previously shown in FIG. 6, a planarizing process such as CMP is conducted so that the top surfaces of the IMD layer 72 and MTJ 62 are coplanar and at the same time form another alignment mark 56 adjacent to the MTJ 62, in which the alignment mark 56 preferably includes a trench 42 within the IMD layer 30 and spacers 68 disposed on two sidewalls of the trench 42. Next, a pattern transfer process along with metal interconnective process are conducted to form metal interconnections or contact plugs 74 on the logic region 16 to electrically connect the metal interconnections 26. This completes the fabrication of a semiconductor device according to an embodiment of the present invention.

Typically before patterning a MTJ stack to form the MTJ 62, a trench 42 serving as an alignment mark 54 is formed adjacent to a predetermined spot of a MTJ after the bottom electrode layer of a MTJ is deposited to improve the accuracy of the patterning process. Since the bottom electrode layer is usually composed of a material having uniform concentration thereby causing more difficulty for the alignment mark 54 to align during the aligning process, the present invention preferably adjusts the material composition of the bottom electrode layer 44 to provide a bottom electrode layer 44 having gradient concentration or more specifically a bottom electrode layer 44 having concentration of nitrogen increase from a bottom surface of the bottom electrode layer 44 toward a top surface of the bottom electrode layer 44 while the concentration of tantalum decreases from a bottom surface of the bottom electrode layer 44 toward a top surface of the bottom electrode layer 44 as disclosed in the aforementioned embodiment. By adjusting the concentration distribution of the bottom electrode layer 44 in this manner, it would be desirable to improve the visibility during the fabrication of alignment mark substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a magnetic tunneling junction (MTJ) on a substrate, wherein the MTJ comprises:
      a bottom electrode layer, wherein the bottom electrode layer comprises a gradient concentration;
      a free layer on the bottom electrode layer; and
      a top electrode layer on the free layer;
   an alignment mark adjacent to the MTJ, wherein the alignment mark comprises:
      a trench; and
      a spacer on sidewalls of the trench.

2. The semiconductor device of claim 1, further comprising:
   a metal interconnection under the MTJ; and
   an inter-metal dielectric (IMD) layer around the metal interconnection and the alignment mark.

3. The semiconductor device of claim 2, wherein a bottom surface of the metal interconnection is lower than a bottom surface of the alignment mark.

4. The semiconductor device of claim 2, wherein the alignment mark comprises:
 the trench in the IMD layer; and
 the spacer on sidewalls of the trench.

\* \* \* \* \*